United States Patent [19]

Fukuda et al.

[11] Patent Number: 5,066,876

[45] Date of Patent: Nov. 19, 1991

[54] CIRCUIT FOR CONVERTING ECL LEVEL SIGNALS TO MOS LEVEL SIGNALS

[75] Inventors: Shinri Fukuda; Eiichi Ishii, both of Tokyo, Japan

[73] Assignee: NEC Corporation, Japan

[21] Appl. No.: 632,167

[22] Filed: Dec. 21, 1990

[30] Foreign Application Priority Data

Dec. 28, 1989 [JP] Japan .................. 1-344543

[51] Int. Cl.$^5$ ................ H03K 19/092; H03K 19/086
[52] U.S. Cl. ............................ 307/475; 307/455; 307/356; 307/559; 307/358; 323/315
[58] Field of Search ........... 307/475, 455, 356, 358, 307/546, 558, 559; 323/315, 316

[56] References Cited

U.S. PATENT DOCUMENTS

| | | | |
|---|---|---|---|
| 3,173,023 | 3/1965 | Talsoe | 307/443 |
| 4,536,665 | 8/1985 | Dayton | 307/475 |
| 4,629,913 | 12/1986 | Lechner | 307/475 |
| 4,644,194 | 2/1987 | Birrittella et al. | 307/475 |
| 4,678,942 | 7/1987 | Kanai et al. | 307/455 |
| 4,684,831 | 8/1987 | Kruest | 323/316 |
| 4,992,681 | 2/1991 | Urakawa et al. | 307/475 |
| 4,999,519 | 3/1991 | Kitsukawa et al. | 307/455 |
| 5,015,888 | 5/1991 | Ouens | 307/475 |

*Primary Examiner*—Stanley D. Miller
*Assistant Examiner*—Scott A. Ouellette
*Attorney, Agent, or Firm*—Laff, Whitesel, Conte & Saret

[57] ABSTRACT

A transistor circuit has a first and a second transistor differentially connected with each other and having bases receiving an input signal therebetween; a first and a second resistor respectively connected between collectors of the first and second transistors and a first power supply terminal; a third transistor having an emitter receiving a voltage dropped by the first resistor and a collector connected to an output terminal; a fourth transistor having an emitter receiving a voltage dropped by the second resistor; and a fifth transistor having a collector connected to the output terminal and an emitter connected to the second power supply terminal. Biasing voltages are provided to bases of the third and fourth transistors thereby causing the fourth transistor to be conductive when the voltage dropped by the first resistor is larger than the voltage dropped by the second resistor and causing the third transistor to be conductive when the voltage dropped by the first resistor is smaller than the voltage dropped by the second resistor. The fifth transistor become conductive when the fourth transistor is in a conductive state. The circuit is capable of operating in a high speed and the output amplitude is such that the low level can be lower to a point just before the saturation of the fifth transistor and the high level can be raised near to the power supply voltage. The power supply voltage required to the circuit is substantially reduced.

17 Claims, 2 Drawing Sheets

CIRCUIT FOR CONVERTING ECL LEVEL SIGNALS TO MOS LEVEL SIGNALS

BACKGROUND OF THE INVENTION

The present invention relates to a level converting circuit and, more particularly, to a level converting circuit for converting an amplitude level of an ECL level to that of a MOS level.

A conventional ECL-MOS level converting circuit of the kind to which the present invention relates and which is generally available is a type in which one output of a differential amplifier is outputted through an emitter-follower circuit. The arrangements employed and the problems existing in such a circuit will be fully explained later to facilitate the understanding of the present invention.

In the conventional level converting circuit referred to above, there is a limit to the lowest power supply voltage and thus such circuit is not suited for use in a low voltage circuit.

SUMMARY OF THE INVENTION

It is, therefore, an object of the present invention to overcome the problems existing in the conventional circuit and to provide an improved level converting circuit which is capable of high speed operation and in which an output amplitude is large and yet it is possible to lower the power supply voltage used.

According to one aspect of the present invention, there is provided an ECL-MOS level converting circuit which is characterized in that the circuit comprises:

a first and a second power supply terminal and a current source;

a first and a second transistor and a first and a second resistor, the first and the second transistor forming a differential amplifier and having their collectors connected respectively to the first power supply terminal through the first and second resistors;

a third transistor and a third and a fourth resistor, the third transistor having an emitter connected to the first power supply terminal through the third resistor, having a collector connected to the second power supply terminal through the fourth resistor and the current source, and having a base and the collector connected with each other;

a fourth transistor having a base connected to the base of the third transistor and an emitter connected to the collector of the second transistor;

a fifth transistor having a base connected to the base of the third transistor and an emitter connected to the collector of the first transistor;

an output terminal connected to a collector of the fifth transistor;

a sixth transistor having a collector connected to the output terminal and an emitter connected to the second power supply terminal;

a means for connecting a base of the sixth transistor to a collector of the fourth transistor;

a first shunting means for shunting to the fifth transistor a part of the current flowing from the current source when the second transistor is in a conductive state; and a second shunting means for shunting to the collector and the base of the sixth transistor the current flowing to the fourth transistor when the first transistor is in a conductive state.

In the circuit according to the present invention, there are provided, for the purposes of preventing the output buffer transistors from being saturated, two diodes or diode-connected transistors disposed at an output stage of a single ended push-pull (SEPP) type which receives differential outputs at their emitters of PNP type transistors. The advantages achieved are that the circuit can operate at a high speed, the output amplitude thereof is such that the low level is lower than was conventionally the case and can be lowered to a point just before the saturation and that the high level can be raised near to the power supply voltage leaving the voltage just before the saturation of the output buffer transistor plus a range of differential logic amplitude, and the power supply voltage required is substantially reduced.

BRIEF DESCRIPTION OF THE DRAWINGS

The above and other objects, features and advantages of the present invention will be apparent from the following description of preferred embodiments of the invention explained with reference to the accompanying drawings, in which.

PREFERRED EMBODIMENTS OF THE INVENTION

Throughout the following explanation, similar reference symbols or numerals refer to the same or similar elements in all the figures of the drawings.

For the purpose of assisting in the understanding of the present invention, a conventional level converting circuit is first described with reference to FIGS. 3 and 4 before the present is explained.

Figure 3:
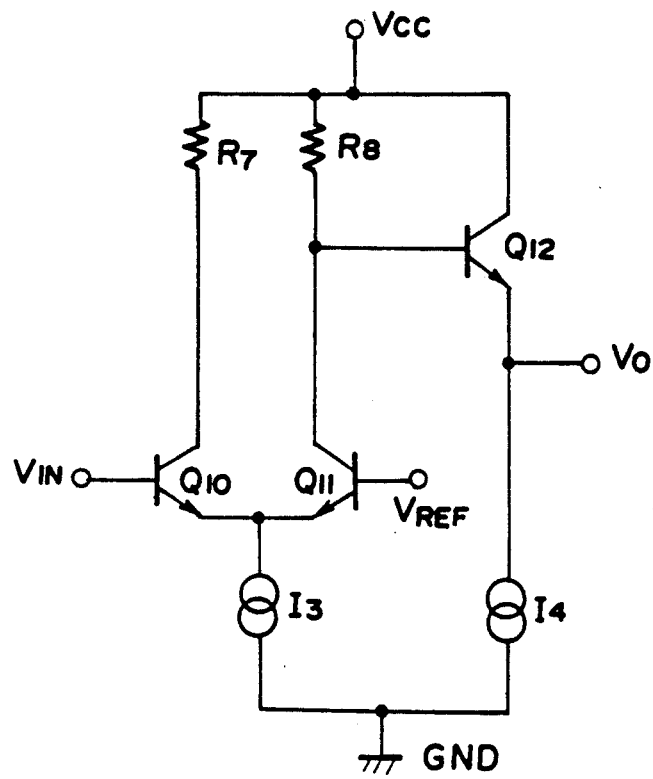
FIG. 3 and FIG. 4 are circuit diarams for illustrating prior art level converting circuits.
Figure 4:
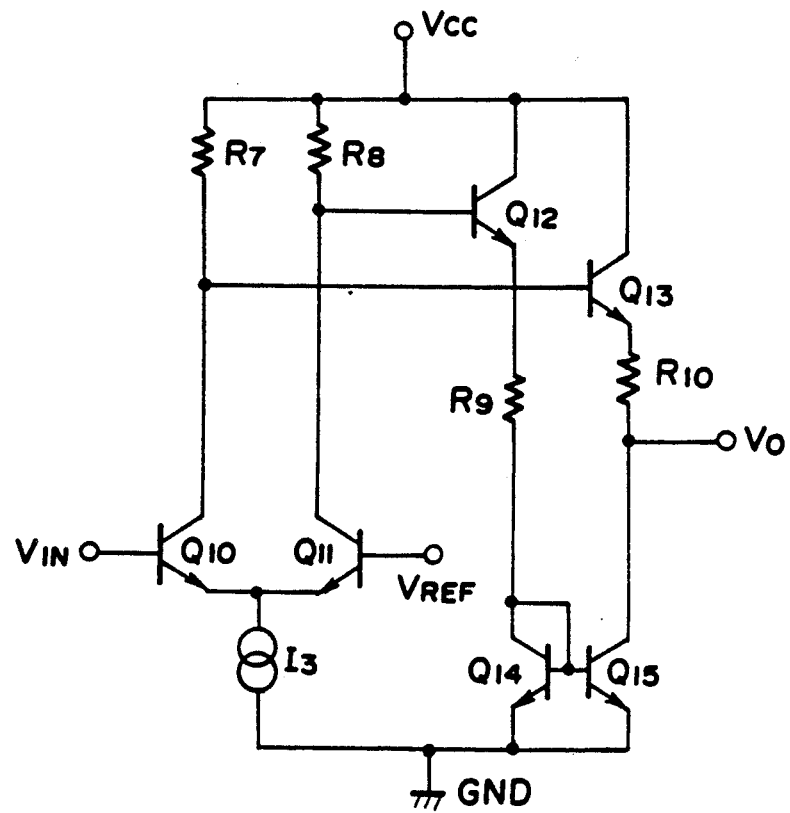

FIG. 3 shows an ECL-MOS level converting circuit of the kind to which the present invention relates and which is of a general type. This circuit is of a type in which one output of a differential amplifier constituted by a pair of transistors $Q_{10}$, $Q_{11}$ is outputted to an output terminal $V_o$ through an emitter-follower circuit of a transistor $Q_{12}$. A circuit shown in FIG. 4 is one in which, in order to obtain a larger output amplitude, respective outputs of the differential amplifier ($Q_{10}$, $Q_{11}$) having phases opposite with each other are received by emitter-follower circuits ($Q_{12}$, $Q_{13}$) with one of the emitter-follower circuits being connected in a current mirror form and in which, by allowing the flow of the current whose phase is opposite to that of the output voltage, it is possible to increase the voltage drop across the load resistor $R_{10}$ and the base-emitter voltage $V_{BE}$ of the emitter-follower transistor $Q_{13}$ and to further lower the low level output.

The conventional ECL-CMOS level converting circuit described above is a circuit which has an emitter-follower output and, therefore, its high level is limited to the extent of $V_{CC}-V_{BE}$. This limits the lowest value of the power supply voltage $V_{CC}$. That is, since the input level in a CMOS circuit is set to $0.7 \times V_{CC}$ as a normal high level minimum, the relation is:

$$0.7 \cdot V_{CC} < V_{CC} - V_{BE}$$

and, thus, it is necessary that the lowest power supply voltage in the above described circuit be:

$$0.3 \times V_{CC} > V_{BE}.$$

When a change of the base-emitter voltage $V_{BE}$ with respect to a temperature change is taken into account, the lowest potential limit in $V_{CC}$ is in the order of 3 V and this renders, to a disadvantage, that the circuit cannot be used as a low voltage circuit.

In view of the various problems or disadvantages which existed in the above described conventional level converting circuits, the present invention aims at providing an improved level converting circuit which is capable of high speed operation and in which an output amplitude is large enough and yet it is possible to lower the power supply voltage used.

Next, the present invention is explained with reference to the appended drawings.

Figure 1:
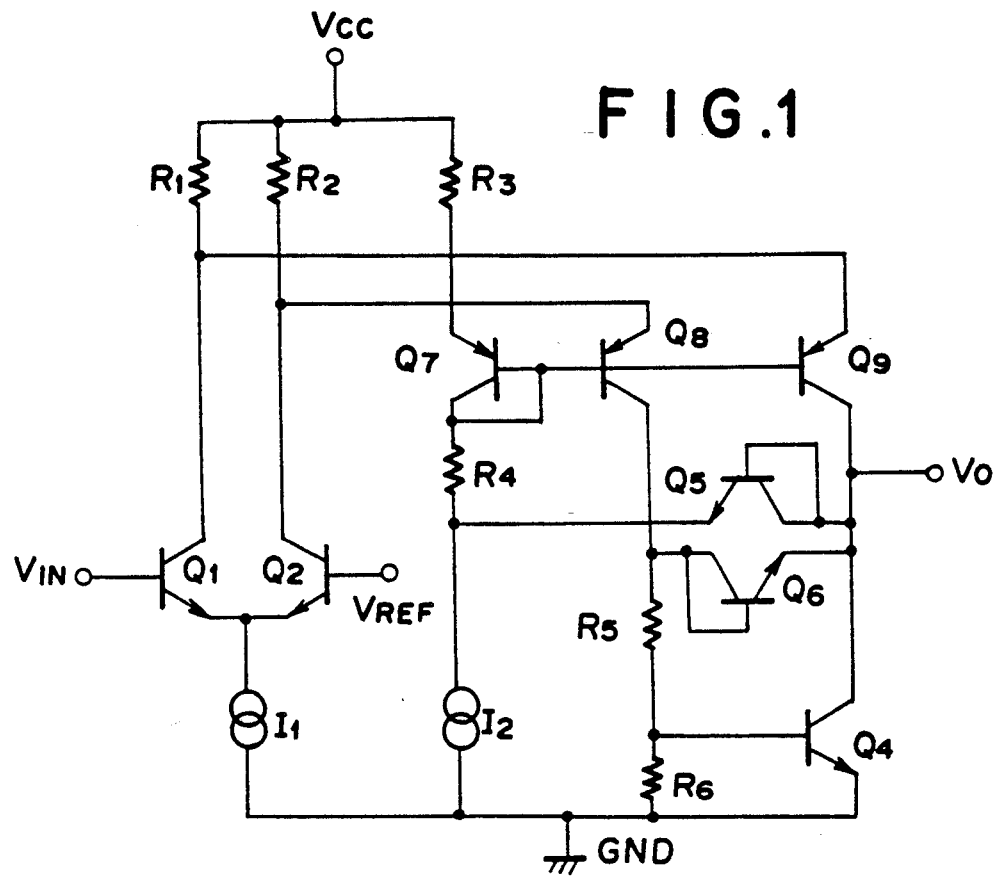
FIG. 1 is a circuit diagram showing a level converting circuit as a first embodiment according to the present invention.

FIG. 1 shows, in a circuit diagram, a circuit of a first embodiment according to the present invention. A pair of NPN transistors $Q_1$, $Q_2$ forming a differential amplifier have their emitters joined together and connected to a constant current source $I_1$. The NPN transistors $Q_1$, $Q_2$ have their collectors respectively connected through a first resistor $R_1$ and a second resistor $R_2$ to a power supply terminal of the voltage $V_{CC}$. As to the transistors $Q_1$ and $Q_2$, the base of one of them may be made as a reference ($V_{REF}$) while the base of the other may be made as an input ($V_{IN}$), or they may constitute a differential amplifier having mutual differential inputs. A PNP transistor $Q_7$ has its emitter connected to the power supply terminal $V_{CC}$ through a resistor $R_3$ and its base and its collector connected together and connected to a constant current source $I_2$ through a resistor $R_4$. The base of the PNP transistor $Q_7$ provides a bias to each of the bases of PNP transistors $Q_8$ and $Q_9$. The PNP transistors $Q_8$, $Q_9$ have their emitters connected respectively to collector outputs of the transistors $Q_2$, $Q_1$ of the differential amplifier and the transistor $Q_8$ has its collector grounded through a serially connected resistors $R_5$ and $R_6$. A transistor $Q_4$ has its collector connected to a collector of the transistor $Q_9$, its base connected to a junction of the resistors $R_5$ and $R_6$ and its emitter connected to ground directly.

The collectors of the transistors $Q_9$, $Q_4$ are commonly connected to an output terminal $V_o$. The circuit of this invention further comprises diode-connected NPN transistors $Q_5$ and $Q_6$. The transistor $Q_5$ has its base and its collector connected together, has its collector connected to the output terminal $V_o$, and has its emitter connected to a junction of the resistor $R_4$ and the constant current source $I_2$, whereby the output buffer transistor $Q_9$ is prevented from becoming saturated when the output terminal $V_o$ turns to its high level. Also, the transistor $Q_6$ has its base and its collector connected together, has its emitter connected to the commonly connected collectors of the buffer transistors $Q_9$, $Q_4$, and has its collector connected to a junction of the collector of the transistor $Q_8$ and the resistor $R_5$, whereby the output buffer transistor $Q_4$ is prevented from becoming saturated when the output terminal $V_o$ turns to its low level.

The saturation of the output buffer transistors $Q_4$, $Q_9$ is prevented because, as well known, it takes time to charge once the transistors are saturated resulting in a slow switching speed. Therefore, the state selected is a state just prior to the transistors becoming saturated and this is effective in achieving a high speed operation, in lowering a voltage level of the transistors concerned, and in increasing an amplitude of the output voltage.

Next, the operation of the circuit is explained. When a switching signal is inputted to an input of the differential amplifier, there appear outputs having respectively opposite phases at the respective emitters of the transistors $Q_8$, $Q_9$. The base potential of the transistor $Q_7$ which provides the necessary biasing is set such that the transistors $Q_8$, $Q_9$ can be turned ON and OFF in accordance with the differential outputs of the differential amplifier. When the transistor $Q_8$ is ON and the transistor $Q_9$ is OFF, the output $V_o$ turns to a low level due to the ON-state of the output transistor $Q_4$. Since the collector of the transistor $Q_6$ has a potential sufficient to cause the transistor $Q_6$ to be ON due to the resistors $R_5$, $R_6$, the current flows to the collector of the transistor $Q_4$ through the transistor $Q_6$ and the driving current of the transistor $Q_4$ is limited, so that the transistor $Q_4$ is not saturated. Therefore, it follows that the low level of the output is lowered to the voltage level just prior to the saturation.

On the contrary, when the transistor $Q_8$ is OFF and the transistor $Q_9$ is ON, the output $V_o$ turns to a high level due to the output transistor $Q_4$ turning to OFF. Since the emitter of the transistor $Q_5$ has a potential sufficient to cause the transistor $Q_5$ to be ON due to the resistor $R_4$, the current flows in the transistor $Q_5$, thereby reducing the current to flow through the PNP transistor $Q_7$ and the resistor $R_3$ and, as a result, the driving current to the PNP transistor $Q_9$ is reduced so that the transistor $Q_9$ is prevented from becoming saturated. The high level of the output $V_o$ swings to the $V_{CC}$ side leaving a voltage corresponding to the voltage drop across the resistor $R_1$ and the level just prior to the saturation of the transistor $Q_9$. Here, as the level just prior to the saturation of the transistor is approximately 0.1–0.3 V and the base-emitter voltage $V_{BE}$ of the same transistor is approximately 1 V, it is obvious that the high level of the output can swing close to the $V_{CC}$ level.

Now, as to the power supply voltage, the transistor $Q_7$ connected to the transistor $Q_8$ and also to the transistor $Q_9$ in a current-mirror configuration allows a constant current to flow therein due to the current source $I_2$ for rendering the voltage level to be of the level just prior to the saturation. Therefore, the power supply voltage is determined by the current passage formed by the resistor $R_3$, the transistor $Q_7$, the resistor $R_4$ and the current source $I_2$. The voltage of this passage is equivalent to the sum of the base-emitter voltage $V_{BE}$ of the transistor $Q_5$, the voltage of the transistor $Q_9$ just prior to saturation, the voltage level of a transistor constituting the current source $I_2$ which transistor is not saturated, and the voltage drop across the resistor $R_1$ which has the same resistance value as the resistor $R_3$. Therefore, the power supply voltage $V_{CC}$ may be expressed by:

$$V_{CC} = V_{BE} + V_{sat(Q9)} + V_{Isat(I2)} + V_{R1}.$$

$V_{R3}$ is in the order of 150 mV and $V_{Isat(I2)}$ is approximately 0.1–0.3 V, which means that it is sufficient for the power supply voltage to be $V_{CC} \approx 1.7$ V and that the power supply voltage may be reduced.

As explained above, the advantages achieved according to the present embodiment are that the power supply voltage $V_{CC}$ may substantially be reduced as far as to approximately 1.7 V and that the amplitude of output level in high level may be increased much closer to the power supply voltage $V_{CC}$ than conventionally was the case.

Figure 2:
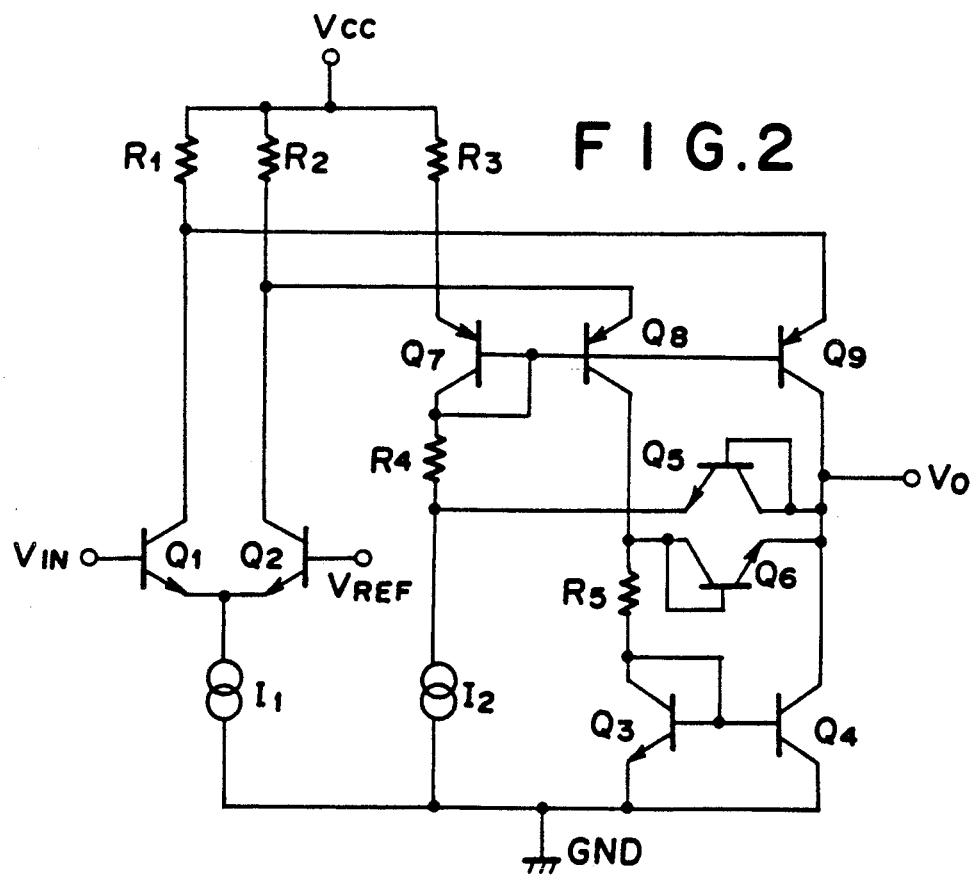
FIG. 2 is a circuit diagram showing a level converting circuit as a second embodiment according to the present invention.

FIG. 2 is a circuit diagram illustrating another embodiment of the present invention. In FIG. 2, the resistor $R_6$ in the circuit of FIG. 1 is replaced with an NPN transistor $Q_3$. The transistor $Q_3$ has its emitter grounded and the its base and collector connected together and connected to the resistor $R_5$ and the base of the transistor $Q_4$.

With the circuit configuration of this second embodiment, it is possible to achieve the same advantages as those obtained by the circuit of the first embodiment explained above.

As explained above, in the level converting circuit according to the present invention, there is provided a shunting circuit which, for the purposes of preventing the output buffer transistors from being saturated, includes two diodes or diode-connected transistors disposed at an output stage of a single ended push-pull type which receives differential outputs at emitters of PNP transistors. The advantages achieved are that the circuit is capable of operating in a high speed, the output amplitude thereof is such that the low level is lower than was conventionally the case and can swing to a point just before the saturation and that the high level towards the power supply voltage $V_{CC}$ to a point leaving the voltage of the PNP transistors just prior to the saturation plus a differential logic amplitude (in the order of 300 mV), and the power supply voltage is widely reduced from the conventional 3 V to 1.7 V.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. A transistor circuit comprising:
   a first and a second power supply terminal and an output terminal;
   a first and a second transistor differentially connected with each other and having bases receiving an input signal therebetween;
   a first and a second resistor respectively connected between collectors of said first and second transistors and said first power supply terminal;
   a third transistor having an emitter receiving a voltage dropped by said first resistor and a collector connected to said output terminal;
   a fourth transistor having an emitter receiving a voltage dropped by said second resistor;
   a fifth transistor having a collector connected to said output terminal and an emitter connected to said second power supply terminal;
   a first means connected between said first and second power supply terminals for providing biasing voltages to bases of said third and fourth transistors thereby causing said fourth transistor to be in a conductive state when said voltage dropped by said first resistor is larger than that said voltage dropped by said second resistor and causing said third transistor to be in a conductive state when said voltage dropped by said first resistor is smaller than said voltage dropped by said second resistor; and
   a second means for rendering said fifth transistor to become conductive when said fourth transistor is in a conductive state.

2. A transistor circuit according to claim 1, in which said first means for providing biasing voltages to said third and fourth transistors comprises a sixth transistor, a third and a fourth resistor, and a current source, said sixth transistor having its emitter connected to said first power supply terminal through said third resistor, having its collector connected to said second power supply terminal through said fourth resistor and said current source, and having its base and collector connected with each other.

3. A transistor circuit according to claim 1, in which said second means comprises a serially connected fifth and sixth resistors connected between a collector of said fourth transistor and said second power supply terminal, said fifth transistor having its base connected to a junction of said fifth and sixth resistors.

4. A transistor circuit according to claim 2, in which said second means comprises a fifth resistor and a seventh transistor, said seventh transistor having its base and collector connected together and coupled to the collector of said fourth transistor through said fifth resistor and connected to the base of said fifth transistor, and having its emitter connected to said second power supply terminal.

5. A transistor circuit according to claim 1, in which said circuit further comprises shunting means for preventing said third and fourth transistors from being saturated while they are in their conductive state.

6. A transistor circuit according to claim 1, in which said first, second and fifth transistors are of NPN type transistors and said third and fourth transistors are of PNP type transistors.

7. A transistor circuit according to claim 1, in which said first power supply terminal is of higher potential and said second power supply terminal is of lower potential.

8. A level converting circuit comprising:
   a first and a second power supply terminal and a current source;
   a first and a second transistor and a first and a second resistor, said first and said second transistor forming a differential amplifier and having their collectors connected respectively to said first power supply terminal through said first and second resistors;
   a third transistor and third and a fourth resistor, said third transistor having an emitter connected to said first power supply terminal through said third resistor, having a collector connected to said second power supply terminal through said fourth resistor and said current source, and having a base and the collector connected with each other;
   a fourth transistor having a base connected to the base of said third transistor and an emitter connected to the collector of said second transistor;
   a fifth transistor having a base connected to the base of said third transistor and an emitter connected to the collector of said first transistor;
   an output terminal connected to a collector of said fifth transistor;
   a sixth transistor having a collector connected to said output terminal and an emitter connected to said second power supply terminal;
   a means for connecting a base of said sixth transistor to a collector of said fourth transistor;

a first shunting means for shunting to said fifth transistor a part of the current flowing from said current source when said second transistor is in a conductive state; and a second shunting means for shunting to the collector and the base of said sixth transistor the current flowing to said fourth transistor when said first transistor is in a conductive state.

9. A level converting circuit according to claim 8, in which said means for connecting the base of said sixth transistor and the collector of said fourth transistor includes a serially connected fifth and sixth resistors through which the collector of said fourth transistor is connected to said second power supply terminal and to the junction of which the base of said sixth transistor is connected.

10. A level converting circuit according to claim 8, in which said first shunting means includes a seventh transistor, said seventh transistor having its base and collector connected together and connected to said output terminal and having its emitter connected to a junction of said fourth resistor and said current source.

11. A level converting circuit according to claim 10, in which said second shunting means includes an eighth transistor, said eighth transistor having its emitter connected to said output terminal and having its base and collector connected together and connected to the collector of said fourth transistor.

12. A level converting circuit according to claim 11, in which said means for connecting the base of said sixth transistor and the collector of said fourth transistor includes a fifth resistor and a ninth transistor, the collector of said fourth transistor being connected to said second power supply terminal through said fifth resistor and the collector-emitter path of said ninth transistor, the base and the collector of said ninth transistor being connected together and connected to the base of said sixth transistor.

13. A level converting circuit according to claim 8, in which said first, second and sixth transistors are of NPN type transistors and said third, fourth and fifth transistors are of PNP type transistors.

14. A level converting circuit according to claim 10, in which said seventh transistor is of an NPN transistor.

15. A level converting circuit according to claim 11, in which said eighth transistor is of an NPN transistor.

16. A level converting circuit according to claim 12, in which said ninth transistor is of an NPN transistor.

17. A level converting circuit according to claim 8, in which said first power supply terminal is of high potential and said second power supply terminal is of lower potential.

* * * * *